(12) United States Patent
Shim et al.

(10) Patent No.: US 10,453,785 B2
(45) Date of Patent: Oct. 22, 2019

(54) SEMICONDUCTOR DEVICE AND METHOD OF FORMING DOUBLE-SIDED FAN-OUT WAFER LEVEL PACKAGE

(71) Applicant: STATS ChipPAC, Ltd., Singapore (SG)

(72) Inventors: Il Kwon Shim, Singapore (SG); Pandi C. Marimuthu, Singapore (SG); Won Kyoung Choi, Singapore (SG); Sze Ping Goh, Singapore (SG); Jose A. Caparas, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 486 days.

(21) Appl. No.: 14/814,906

(22) Filed: Jul. 31, 2015

(65) Prior Publication Data

US 2016/0043047 A1 Feb. 11, 2016

Related U.S. Application Data

(60) Provisional application No. 62/034,354, filed on Aug. 7, 2014.

(51) Int. Cl.
*H01L 23/498* (2006.01)
*H01L 21/56* (2006.01)
(Continued)

(52) U.S. Cl.
CPC ........ *H01L 23/49838* (2013.01); *H01L 21/56* (2013.01); *H01L 21/561* (2013.01); *H01L 23/3178* (2013.01); *H01L 23/5385* (2013.01); *H01L 23/5389* (2013.01); *H01L 24/19* (2013.01); *H01L 24/20* (2013.01); *H01L 24/24* (2013.01); *H01L 24/96* (2013.01);
(Continued)

(58) Field of Classification Search
CPC . H01L 21/56; H01L 23/3178; H01L 23/5389; H01L 23/49838; H01L 2924/15151
See application file for complete search history.

(56) References Cited

U.S. PATENT DOCUMENTS

| 7,259,457 B2 * | 8/2007 | Zhang | H01L 23/13 257/706 |
| 2003/0082845 A1 * | 5/2003 | Hoffman | H01L 23/13 438/106 |

(Continued)

*Primary Examiner* — Mark W Tornow
*Assistant Examiner* — Abbigale A Boyle
(74) *Attorney, Agent, or Firm* — Robert D. Atkins; Patent Law Group: Atkins and Associates, P.C.

(57) ABSTRACT

A semiconductor device comprises a first semiconductor package including a conductive layer. A substrate including an interconnect structure is disposed over the conductive layer. The interconnect structure of the substrate with the conductive layer of the first semiconductor package are self-aligned. A plurality of openings is formed in the substrate. An adhesive is disposed between the substrate and the first semiconductor package and in the openings of the substrate. A redistribution layer (RDL) is formed over the first semiconductor package opposite the substrate. A pitch of the substrate is different from a pitch of the RDL. The adhesive extends to the interconnect structure of the substrate. A second semiconductor package is disposed over the substrate and the first semiconductor package.

25 Claims, 12 Drawing Sheets

(51) Int. Cl.
  *H01L 23/31* (2006.01)
  *H01L 23/00* (2006.01)
  *H01L 25/10* (2006.01)
  *H01L 23/538* (2006.01)

(52) U.S. Cl.
  CPC ............ *H01L 24/97* (2013.01); *H01L 25/105* (2013.01); *H01L 21/568* (2013.01); *H01L 23/3128* (2013.01); *H01L 23/49816* (2013.01); *H01L 23/5386* (2013.01); *H01L 2224/12105* (2013.01); *H01L 2224/131* (2013.01); *H01L 2224/16227* (2013.01); *H01L 2224/24155* (2013.01); *H01L 2225/107* (2013.01); *H01L 2225/1035* (2013.01); *H01L 2225/1058* (2013.01); *H01L 2924/13091* (2013.01); *H01L 2924/15151* (2013.01); *H01L 2924/15311* (2013.01); *H01L 2924/18162* (2013.01); *H01L 2924/3511* (2013.01)

(56) References Cited

U.S. PATENT DOCUMENTS

| | | | |
|---|---|---|---|
| 2008/0157330 A1* | 7/2008 | Kroehnert | H01L 21/4871 257/686 |
| 2009/0166886 A1* | 7/2009 | Kim | H01L 21/563 257/777 |
| 2010/0327419 A1* | 12/2010 | Muthukumar | H01L 23/3121 257/686 |
| 2012/0241925 A1* | 9/2012 | Yoon | H01L 21/563 257/666 |
| 2014/0264946 A1* | 9/2014 | Kim | H01L 25/0657 257/777 |
| 2015/0137338 A1* | 5/2015 | Lin | H01L 23/49816 257/676 |

\* cited by examiner

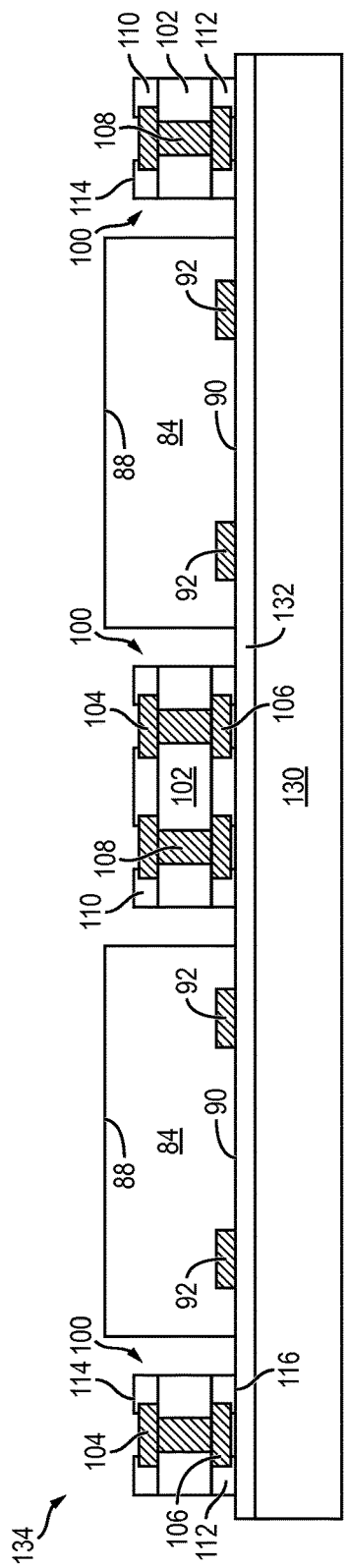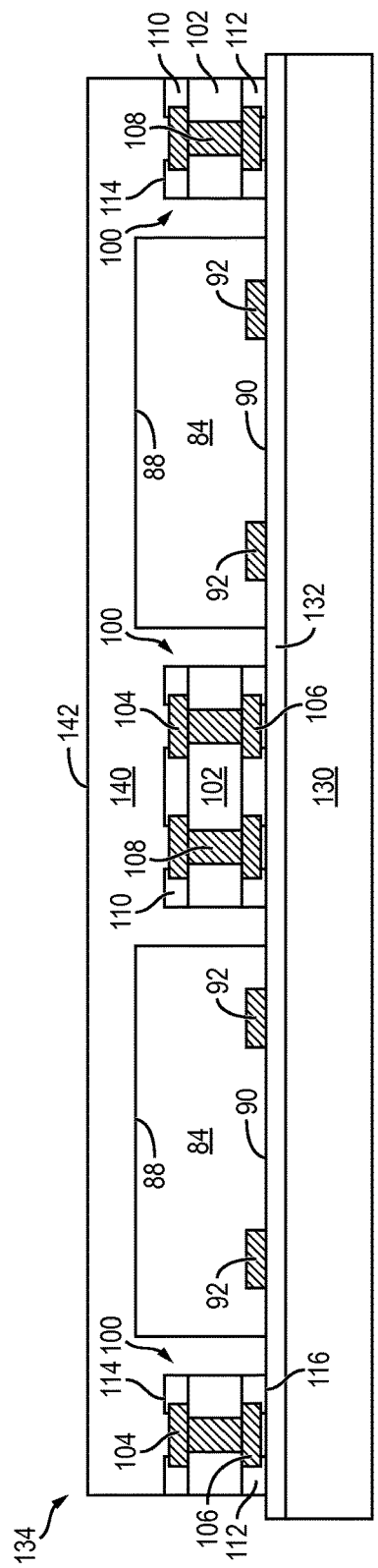

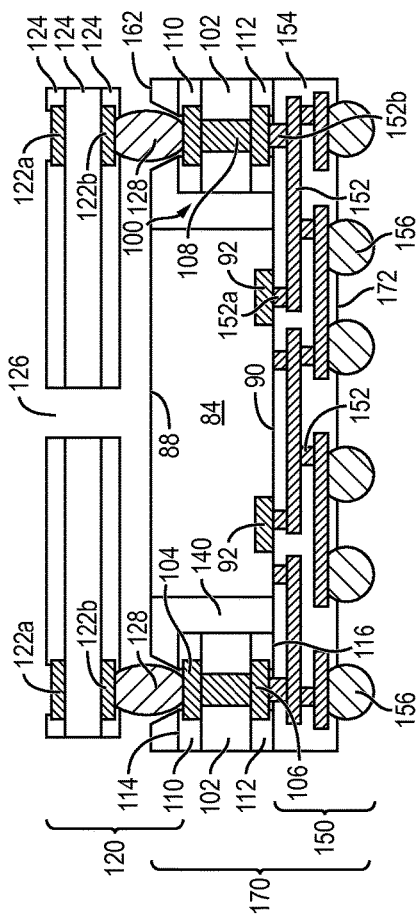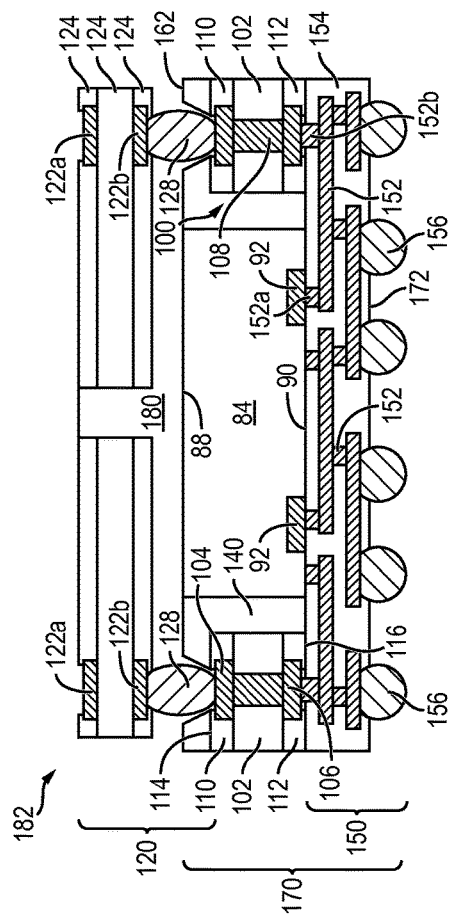

SEMICONDUCTOR DEVICE AND METHOD OF FORMING DOUBLE-SIDED FAN-OUT WAFER LEVEL PACKAGE

CLAIM OF DOMESTIC PRIORITY

The present application claims the benefit of U.S. Provisional Application No. 62/034,354, filed Aug. 7, 2014, which application is incorporated herein by reference.

FIELD OF THE INVENTION

The present invention relates in general to semiconductor devices and, more particularly, to a semiconductor device and method of forming a wafer level package with the ability to fan-out signals on both an upper and a lower surface of the wafer level package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to integrate semiconductor devices into a single package. Integration of semiconductor devices can be accomplished by forming stacking packaged semiconductor devices to form a Package on Package (PoP) integrated device. However, the PoP top (PoPt) package may have different ball pitch or layout from the PoP bottom (PoPb) package. If so, the bottom package needs to be re-routed to accommodate the differing ball layouts between PoPt and PoPb packages. One solution to different ball pitch or layout between PoPt and PoPb packages is to form a redistribution layer (RDL) on both an upper side and a lower side of the PoPb. The dual side RDL solution has the advantage of ensuring proper alignment between the RDLs and the PoPb. However, the dual side RDL solution requires additional processing steps, including a temporary bonding and debonding process, increasing costs and reducing throughput.

SUMMARY OF THE INVENTION

A need exists to integrate PoPt and PoPb packages with differing ball pitches or layouts, while ensuring proper alignment and minimizing costs and processing steps. Accordingly, in one embodiment, the present invention is a method of making a semiconductor device comprising the steps of providing a semiconductor package including a conductive layer, providing a substrate including an interconnect structure, disposing the substrate over the semiconductor package, bonding the interconnect structure of the substrate with the conductive layer of the semiconductor package, and disposing an adhesive through an opening in the substrate and between the substrate and the semiconductor package after bonding the interconnect structure of the substrate with the conductive layer of the semiconductor package.

In another embodiment, the present invention is a method of making a semiconductor device comprising the steps of providing a semiconductor package, providing a substrate including an opening in the substrate, disposing the substrate over the semiconductor package, and disposing an adhesive through the opening and between the substrate and the semiconductor package after disposing the substrate over the semiconductor package.

In another embodiment, the present invention is a semiconductor device comprising a semiconductor package including a conductive layer. A substrate including an interconnect structure is disposed over the conductive layer. An adhesive is disposed between the substrate and the semiconductor package and in an opening of the substrate.

In another embodiment, the present invention is a semiconductor device comprising a semiconductor package. A substrate including an opening in the substrate is disposed over the semiconductor package. An adhesive is disposed between the substrate and the semiconductor package.

BRIEF DESCRIPTION OF THE DRAWINGS

FIGS. 5a-5j illustrate a method of forming a double-sided fan-out wafer level package.

DETAILED DESCRIPTION OF THE DRAWINGS

Figure 1:
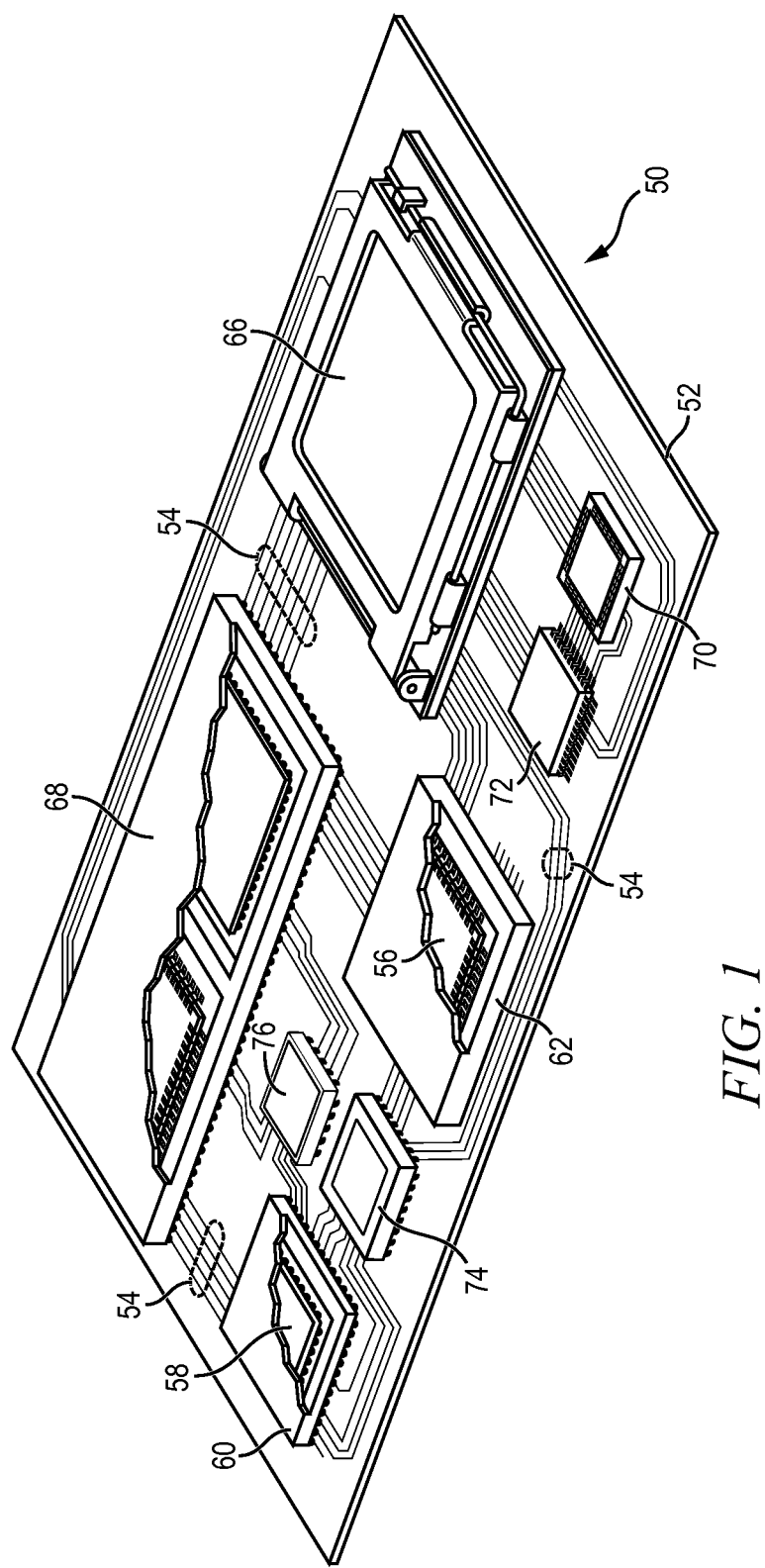
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
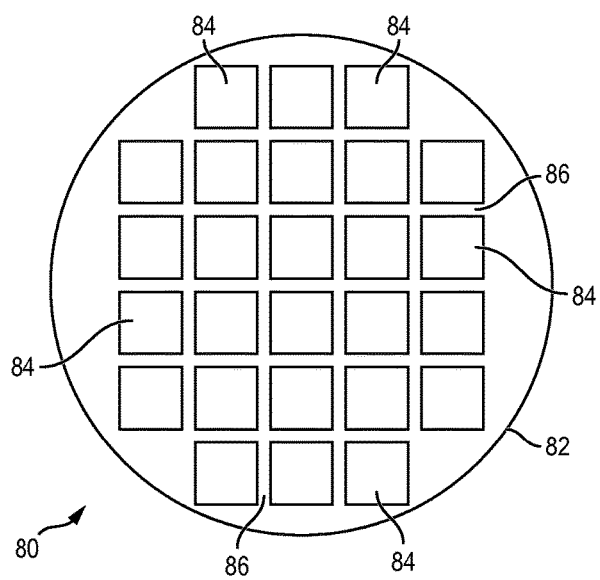
FIGS. 2a-2d illustrate a semiconductor wafer with a plurality of semiconductor die separated by a saw street.

FIG. 2a shows a semiconductor wafer 80 with a base substrate material 82, such as silicon, germanium, aluminum phosphide, aluminum arsenide, gallium arsenide, gallium nitride, indium phosphide, silicon carbide, or other bulk semiconductor material for structural support. A plurality of semiconductor die or components 84 is formed on wafer 80 separated by a non-active, inter-die wafer area or saw street 86 as described above. Saw street 86 provides cutting areas to singulate semiconductor wafer 80 into individual semiconductor die 84. In one embodiment, semiconductor wafer 80 has a width or diameter of 100-450 millimeters (mm).

Figure 2B:
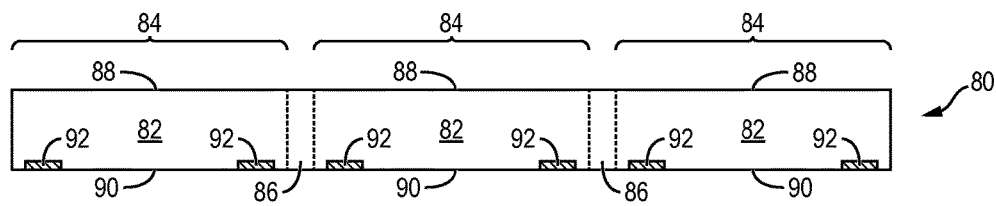

FIG. 2b shows a cross-sectional view of a portion of semiconductor wafer 80. Each semiconductor die 84 has a back or non-active surface 88 and an active surface 90 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 90 to implement analog circuits or digital circuits, such as digital signal processor (DSP), ASIC, MEMS, memory, or other signal processing circuit. In one embodiment, active surface 90 contains a MEMS, such as an accelerometer, gyroscope, strain gauge, microphone, or other sensor responsive to various external stimuli.

An electrically conductive layer 92 is formed over active surface 90 of semiconductor die 84 using PVD, CVD, electrolytic plating, electroless plating process, or other suitable metal deposition process. Conductive layer 92 includes one or more layers of aluminum (Al), copper (Cu), tin (Sn), nickel (Ni), gold (Au), silver (Ag), or other suitable electrically conductive material or combination thereof. Conductive layer 92 operates as contact pads electrically connected to the circuits on active surface 90. Conductive layer 92 is formed as contact pads disposed side-by-side a first distance from the edge of semiconductor die 84, as shown in FIG. 2b. Alternatively, conductive layer 92 is formed as contact pads that are offset in multiple rows such that a first row of contact pads is disposed a first distance from the edge of the die, and a second row of contact pads alternating with the first row is disposed a second distance from the edge of the die. In one embodiment, back surface 88 of semiconductor wafer 80 undergoes an optional back-grinding operation with a grinder or other suitable mechanical or etching process to remove a portion of base substrate material 82 and reduce the thickness of semiconductor wafer 80 including semiconductor die 84.

Semiconductor wafer 80 undergoes electrical testing and inspection as part of a quality control process. Manual visual inspection and automated optical systems are used to perform inspections on semiconductor wafer 80. Software can be used in the automated optical analysis of semiconductor wafer 80. Visual inspection methods may employ equipment such as a scanning electron microscope, high-intensity or ultra-violet light, or metallurgical microscope. Semiconductor wafer 80 is inspected for structural characteristics including warpage, thickness variation, surface particulates, irregularities, cracks, delamination, and discoloration.

Figure 2C:
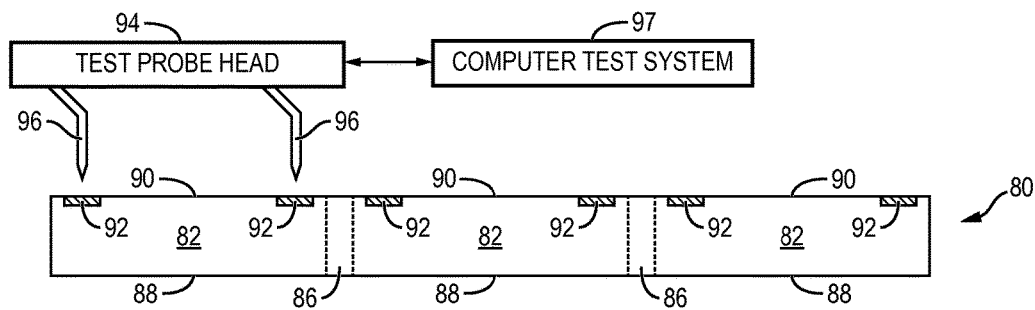

The active and passive components within semiconductor die 84 undergo testing at the wafer level for electrical performance and circuit function. Each semiconductor die 84 is tested for functionality and electrical parameters, as shown in FIG. 2c, using a test probe head 94 including a plurality of probes or test leads 96, or other testing device. Probes 96 are used to make electrical contact with nodes or conductive layer 92 on each semiconductor die 84 and provide electrical stimuli to the contact pads. Semiconductor die 84 responds to the electrical stimuli, which is measured by computer test system 97 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 80 enables semiconductor die 84 that pass to be designated as known good die (KGD) for use in a semiconductor package.

Figure 2D:
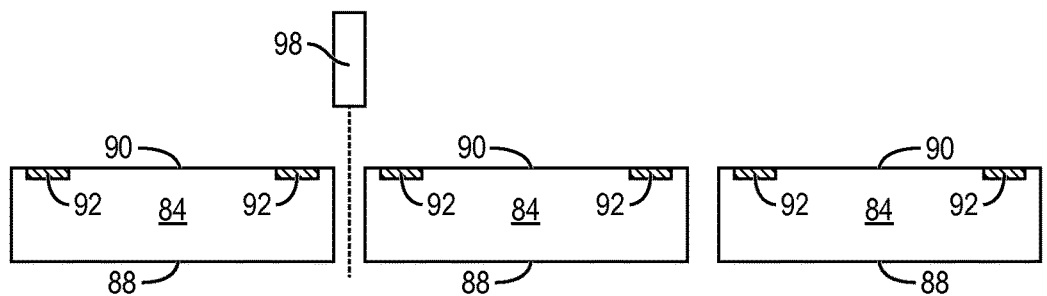

In FIG. 2d, semiconductor wafer 80 is singulated through saw street 86 using a saw blade or laser cutting tool 98 into individual semiconductor die 84. Individual semiconductor die 84 can be inspected and electrically tested for identification of KGD post singulation.

Figure 3:
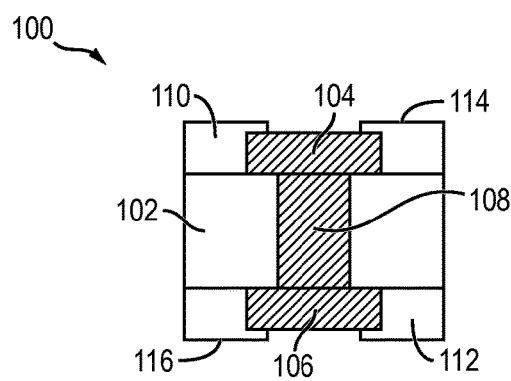
FIG. 3 illustrates a vertical interconnect structure.

FIG. 3 shows a vertical interconnect structure 100 with base material 102 such as metal, silicon, polymer, polymer composite, ceramic, glass, glass epoxy, beryllium oxide, or other suitable low-cost, rigid material or bulk semiconductor material for structural support. Alternatively, base material 102 can be one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics.

Conductive layers 104 and 106 are formed on opposing surfaces of base material 102. Conductive layers 104 and 106 can be one or more layers of Al, Cu, Sn, Ni, Au, Ag, or other suitable electrically conductive material formed by electrolytic plating or electroless plating for electrical interconnect. The layout of conductive layers 104 and 106 and base material 102 typically uses silk screen printing, photoengraving, PCB milling, electroless plating, or electroplating process.

Vertical interconnect conductive plated through holes (PTH) 108 are formed through base material 102. One or more vias are formed through base material 102 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive PTH 108.

Insulating or passivation layers 110 and 112 are formed over opposing surfaces of vertical interconnect structure 100 using PVD, CVD, printing, spin coating, spray coating, sintering or thermal oxidation. Insulating layers 110 and 112 contain one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. Insulating layer 110 forms front surface 114 of vertical interconnect structure 100. Insulating layer 112 forms back surface 116 of vertical interconnect structure 100. A portion of insulating layers 110 and 112 is removed by an etching process to expose conductive layers 104 and 106, respectively.

Figure 4A:
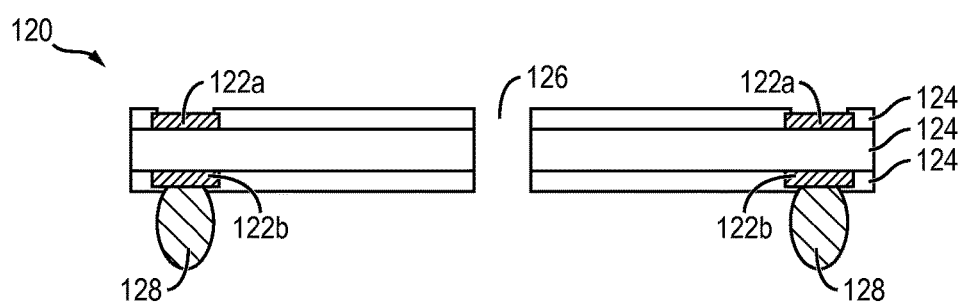
FIGS. 4a-4e illustrate substrate interposers including an opening or a plurality of openings formed through the substrate interposer.

FIG. 4a shows a substrate interposer or PCB 120 suitable for mounting semiconductor die 84. Substrate interposer 120 contains one or more conductive layers 122a-122b formed on laminated insulating or dielectric layers 124. Substrate interposer 120 can be silicon, germanium, gallium arsenide, indium phosphide, silicon carbide, polymer, beryllium oxide, or other suitable rigid material for structural support. Alternatively, insulating layers 124 can be one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Conductive layer 122a-122b can be one or more layers of Al, Cu, Sn, Ni, Au, Ag, or other suitable electrically conductive material formed by electrolytic plating or electroless plating for electrical interconnect. The layout of conductive layer 122a-122b and insulating layers 124 typically uses silk screen printing, photoengraving, PCB milling, electroless plating, or electroplating process.

An electrically conductive bump material is deposited over conductive layer 122b using an evaporation, electrolytic plating, electroless plating, ball drop, or screen printing process. The bump material can be Al, Sn, Ni, Au, Ag, Pb, bismuth (Bi), Cu, solder, and combinations thereof, with an optional flux solution. For example, the bump material can be eutectic Sn/Pb, high-lead solder, or lead-free solder. The bump material is bonded to conductive layer 122b using a suitable attachment or bonding process. In one embodiment, the bump material is reflowed by heating the material above its melting point to form spherical balls or bumps 128. In some applications, bumps 128 are reflowed a second time to improve electrical contact to conductive layer 122b. In one embodiment, bumps 128 are formed over an under bump metallization (UBM) having a wetting layer, barrier layer, and adhesive layer. The bumps can also be compression bonded or thermocompression bonded to conductive layer 122b. Bumps 128 represent one type of interconnect structure that can be formed over conductive layer 122b. The interconnect structure can also use bond wires, conductive paste, stud bump, micro bump, or other electrical interconnect.

Substrate interposer 120 includes one or more openings 126 formed through the substrate interposer. The openings 126 may be formed in a central area of substrate interposer 120. In one embodiment, substrate interposer 120 includes multiple openings 126 formed through the substrate interposer in a central area, near a perimeter, or in any area of the substrate interposer without electrical interconnections 128.

Figure 4E:
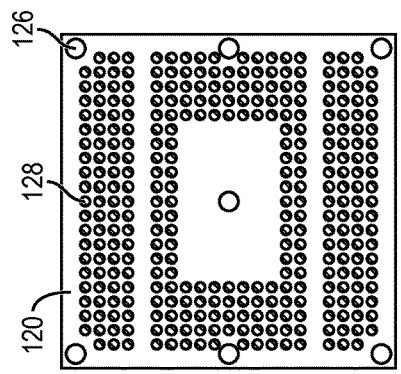
Figure 4D:
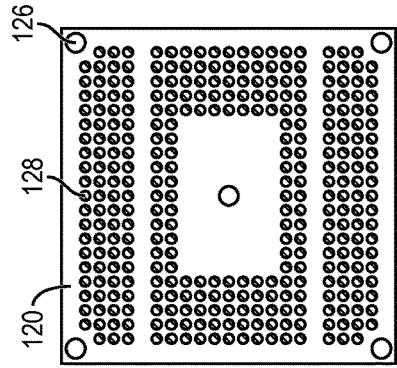
Figure 4C:
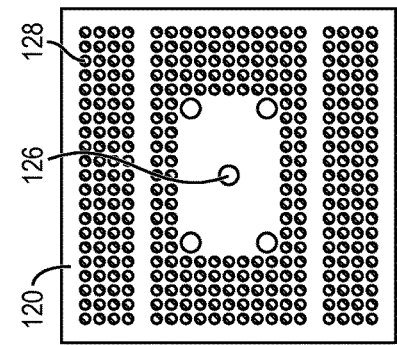
Figure 4B:
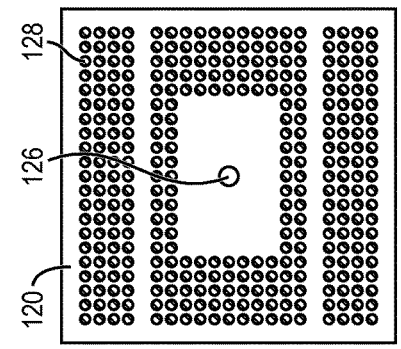

FIGS. 4b-4e show plan views of exemplary layouts of substrate interposer 120, openings 126, and electrical interconnections 128. In FIG. 4b, a single opening 126 is formed in a central area of substrate interposer 120. In FIG. 4c, multiple openings 126 are formed in a central area of substrate interposer 120. In FIG. 4d, a single opening 126 is formed in a central area of substrate interposer 120 and additional openings 126 are formed in each corner of the substrate interposer. In FIG. 4e, a single opening 126 is formed in a central area of substrate interposer 120 and additional openings are formed along the perimeter of the substrate interposer. Any area of substrate interposer 120 without electrical interconnections or bumps 128 is suitable for formation of openings 126 through the substrate interposer. Additional layouts of openings 126 through substrate interposer 120 are possible without departing from the scope of the present invention.

Figure 5C:
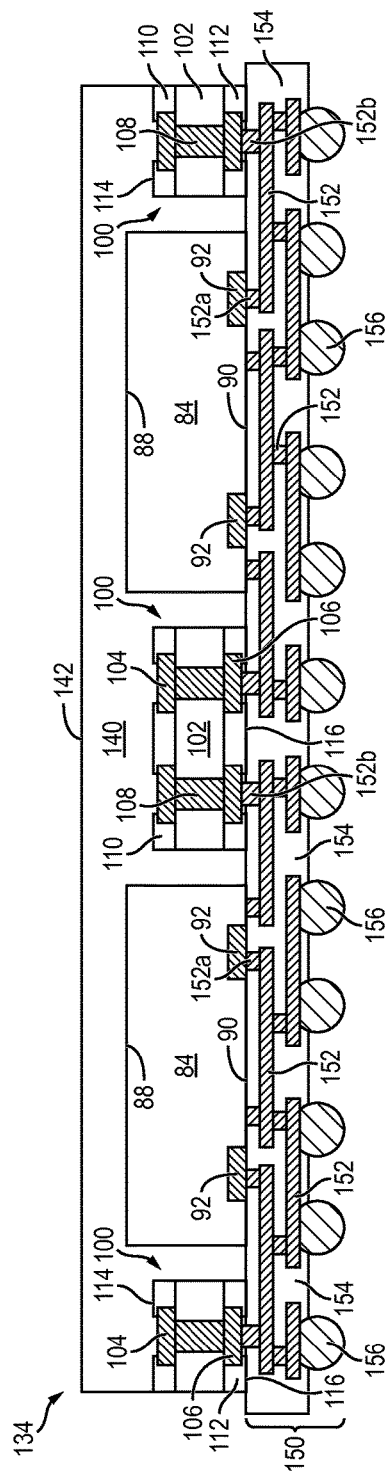

FIGS. 5a-5j illustrate, in relation to FIG. 1, a method of forming a double sided fan-out wafer level package. FIG. 5a shows a cross-sectional view of a portion of a carrier or temporary substrate 130 containing sacrificial base material such as silicon, polymer, beryllium oxide, glass, or other suitable low-cost, rigid material for structural support. An interface layer or double-sided tape 132 is formed over carrier 130 as a temporary adhesive bonding film, etch-stop layer, or thermal release layer.

Carrier 130 can be a round or rectangular panel (greater than 300 mm) with capacity for multiple semiconductor die 84. Carrier 130 may have a larger surface area than the surface area of semiconductor wafer 80. A larger carrier reduces the manufacturing cost of the semiconductor package as more components or semiconductor die can be processed on the larger carrier thereby reducing the cost per unit. Semiconductor packaging and processing equipment are designed and configured for the size of the wafer or carrier being processed.

To further reduce manufacturing costs, the size of carrier 130 is selected independent of the size of semiconductor die 84 or semiconductor wafer 80. That is, carrier 130 has a fixed or standardized size, which can accommodate various size semiconductor die 84 singulated from one or more semiconductor wafers 80. In one embodiment, carrier 130 is circular with a diameter of 330 mm. In another embodiment, carrier 130 is rectangular with a width of 560 mm and length of 600 mm. Semiconductor die 84 may have dimensions of 10 mm by 10 mm, which are placed on the standardized carrier 130. Alternatively, semiconductor die 84 may have dimensions of 20 mm by 20 mm, which are placed on the same standardized carrier 130. Accordingly, standardized carrier 130 can handle any size of semiconductor die 84, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 130 lowers manufacturing costs and capital risk by reducing or eliminating the need for specialized semiconductor processing lines based on die size or incoming wafer size. By selecting a predetermined carrier size to use for any size component or semiconductor die from all semiconductor wafer sizes, a flexible manufacturing line can be implemented.

Vertical interconnect structures 100 from FIG. 3 and semiconductor die 84 from FIG. 2d are mounted to interface layer 132 and over carrier 130 using, for example, a pick and place operation with back surface 116 of vertical interconnect structures 100 and active surface 90 of semiconductor die 84 oriented toward the carrier. FIG. 5a shows semiconductor die 84 and vertical interconnect structures 100 mounted to interface layer 132 of carrier 130 as reconstituted panel or reconfigured wafer 134. In one embodiment, vertical interconnect structures 100 have a height less than a height of semiconductor die 84.

In FIG. 5b, an encapsulant or molding compound 140 deposited over reconstituted panel 134 including vertical interconnect structures 100, semiconductor die 84, and carrier 130 using a paste printing, compressive molding, transfer molding, liquid encapsulant molding, vacuum lamination, or other suitable applicator. In one embodiment, encapsulant 140 is deposited using film-assisted molding process to leave a backside of semiconductor die 84 devoid of the encapsulant. Encapsulant 140 can be polymer composite material, such as epoxy resin with filler, epoxy acrylate with filler, or polymer with proper filler. Encapsulant 140 is non-conductive, provides physical support, and environmentally protects the semiconductor device from external elements and contaminants. Encapsulant 140 is deposited between vertical interconnect structures 100 and semiconductor die 84 to cover the side surfaces of vertical interconnect structures 100 and semiconductor die 84. In one embodiment, encapsulant 140 includes surface 142 over front surface 114 of vertical interconnect structures 100 and back surface 88 of semiconductor die 84.

In FIG. 5c, temporary carrier 130 and optional interface layer 132 are removed from reconstituted panel 134 by chemical etching, mechanical peel-off, chemical mechanical planarization (CMP), mechanical grinding, thermal bake, laser scanning, or wet stripping. Back surface 116 of vertical interconnect structures 100 and active surface 90 of semiconductor die 84 are exposed after carrier 130 and interface layer 132 are removed.

In FIG. 5c, a build-up interconnect structure 150 is formed over vertical interconnect structures 100, semiconductor die 84, and encapsulant 140. Build-up interconnect structure 150 includes an electrically conductive layer or RDL 152 formed using a patterning and metal deposition process such as sputtering, electrolytic plating, and electroless plating. Conductive layer 152 can be one or more layers of Al, Cu, Sn, Ni, Au, Ag, or other suitable electrically conductive material. Conductive layer 152a is electrically connected to contact pads 92, and conductive layer 152b is electrically connected to conductive layer 106 of vertical interconnect structures 100. Other portions of conductive layer 152 can be electrically common or electrically isolated depending on the design and function of semiconductor die 84. The build-up interconnect structure 150 further includes an insulating or passivation layer 154 formed between conductive layers 152 for electrical isolation. The insulating layer 154 contains one or more layers of SiO2, Si3N4, SiON, Ta2O5, Al2O3, or other material having similar insulating and structural properties. The insulating layer 154 is formed using PVD, CVD, printing, spin coating, spray coating, sintering or thermal oxidation. A portion of insulating layer 154 is removed by an etching process to expose conductive layer 152 for bump formation or additional package interconnect.

An electrically conductive bump material is deposited over conductive layer 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form spherical balls or bumps 156. In some applications, bumps 156 are reflowed a second time to improve electrical contact to conductive layer 152. In one embodiment, bumps 156 are formed over a UBM having a wetting layer, barrier layer, and adhesive layer. The bumps can also be compression bonded or thermocompression bonded to conductive layer 152. Bumps 156 represent one type of interconnect structure that can be formed over conductive layer 152. The interconnect structure can also use bond wires, conductive paste, stud bump, micro bump, or other electrical interconnect.

Figure 5D:
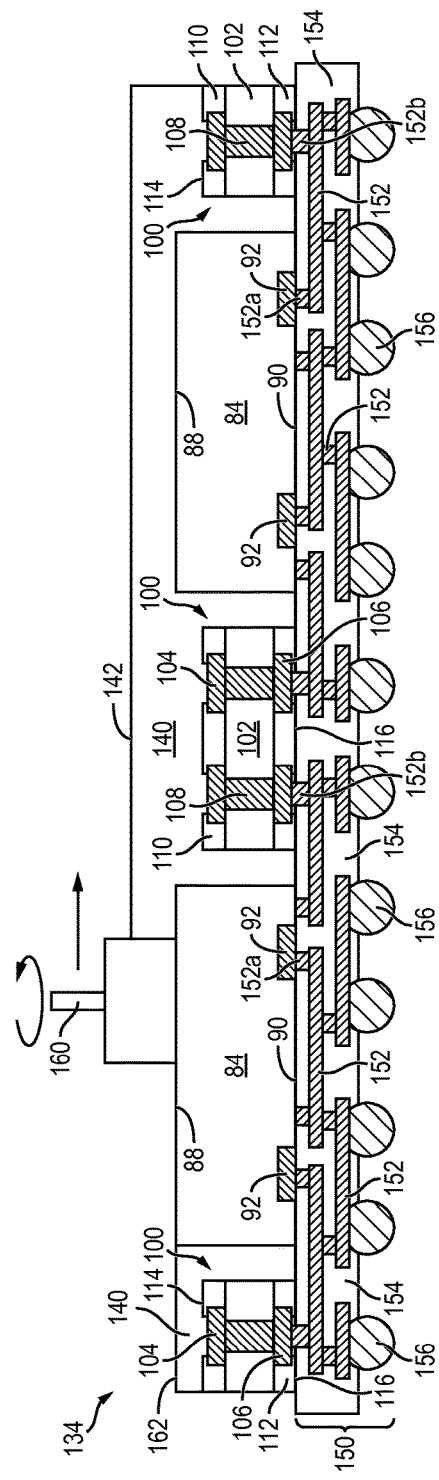

In FIG. 5d, backside surface 142 of encapsulant 140 undergoes an optional grinding operation with grinder 160 to planarize and reduce a thickness of encapsulant 140 and semiconductor die 84. The grinding operation removes a portion of encapsulant 140, leaving new back surface 162 of reconstituted panel 134. In one embodiment, encapsulant 140 is removed down to back surface 88 of semiconductor die 84. In one embodiment, grinder 160 removes encapsulant 140 and a portion of back surface 88 of semiconductor die 84, leaving new back surface 162 of reconstituted panel 134. A chemical etch can also be used to planarize and remove a portion of encapsulant 140 and semiconductor die 84. A chemical etch, CMP, or plasma dry etch can also be used to remove back grinding damage and residue stress on semiconductor die 84 and encapsulant 140 to enhance the package strength of reconstituted panel 134. In one embodiment, a portion of encapsulant 140 remains over semiconductor die 84 after back grinding.

Figure 5E:
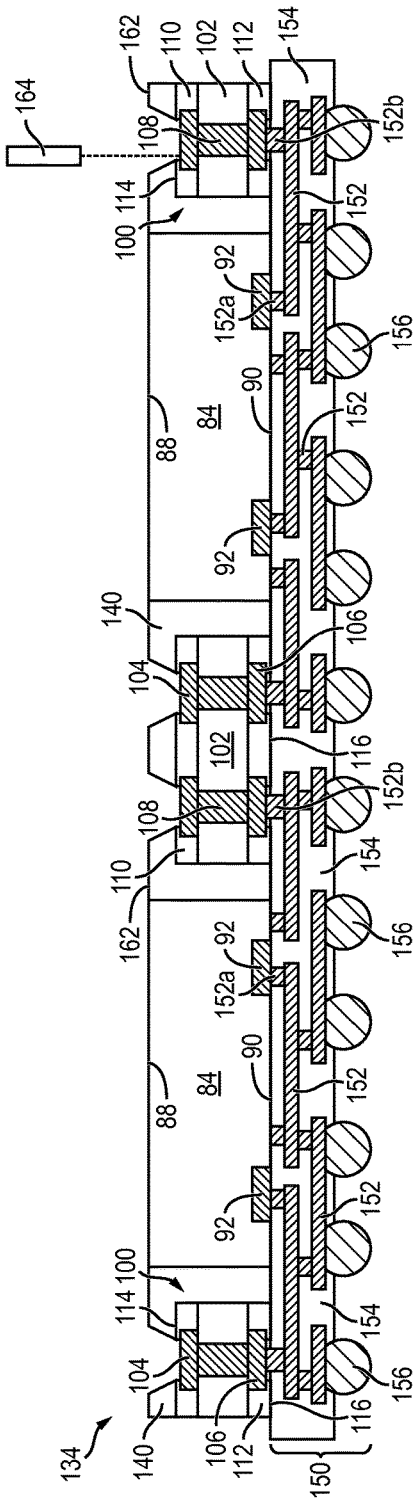

In FIG. 5e, a portion of encapsulant 140 is removed by laser direct ablation (LDA) using laser 164, etching, or other suitable process to expose portions of conductive layer 104.

Figure 5F:
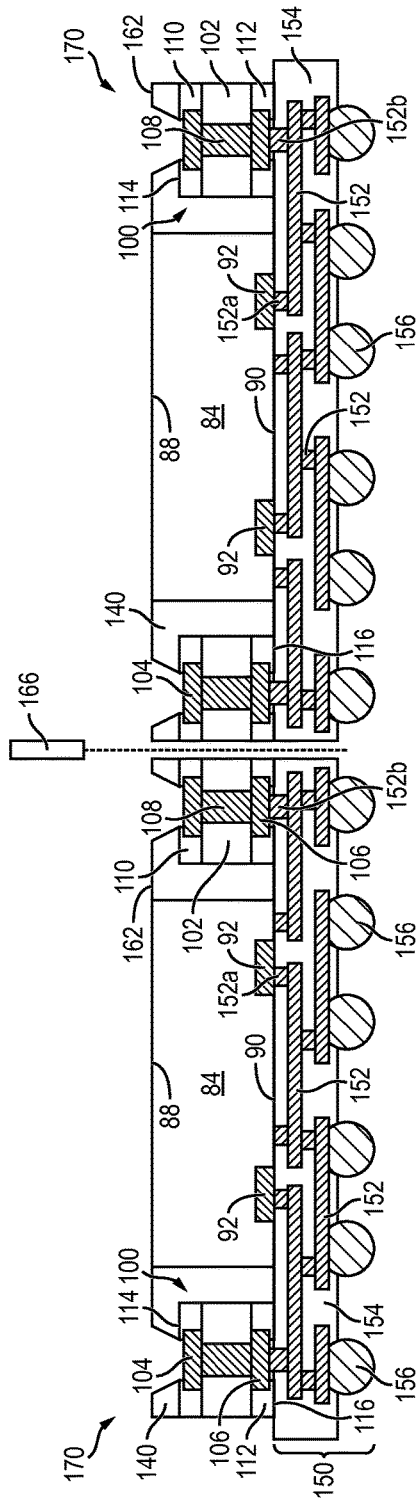

In FIG. 5f, reconstituted panel 134 is singulated with saw blade or laser cutting device 166 through vertical interconnect structures 100 and interconnect structure 150 into individual eWLB 170.

Figure 5G:
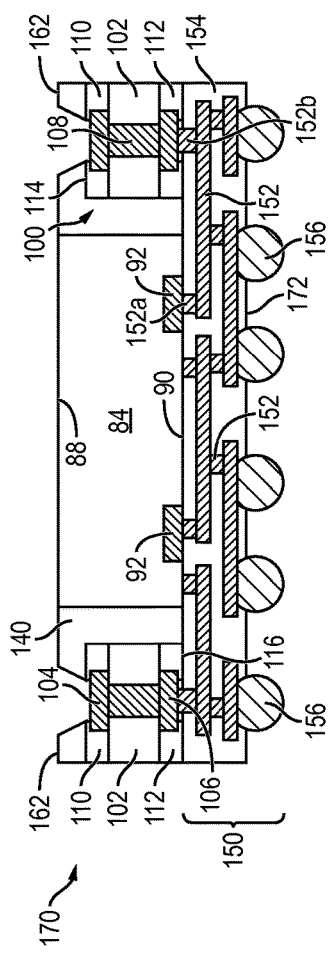

FIG. 5g shows eWLB 170. The interconnect pitch on a first surface 162 of eWLB 170 may be different from an interconnect pitch on a second surface 172 of the eWLB opposite the first surface.

Figure 5H:
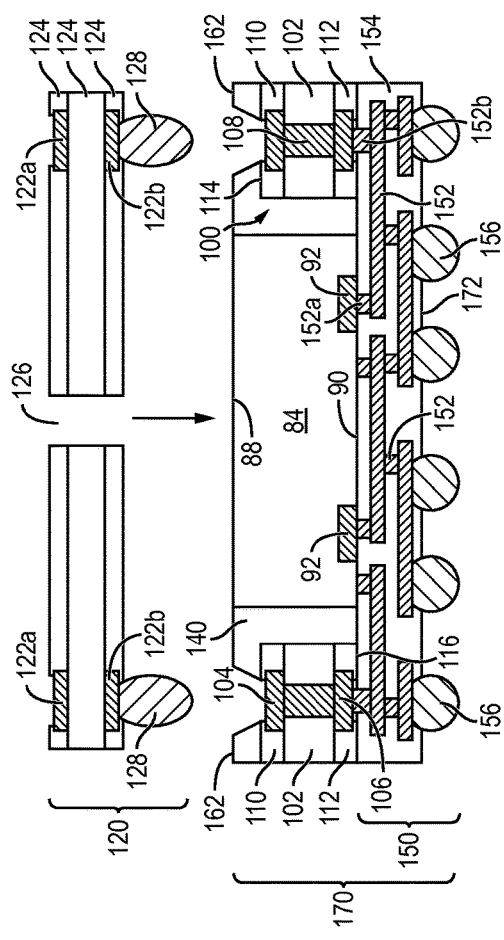

In FIG. 5h, substrate interposer 120 from FIG. 4a is mounted over first surface 162 of eWLB 170 using, for example, a pick and place operation with bumps 128 of substrate interposer 120 aligned with openings in encapsulant 140 exposing conductive layer 104 of eWLB 170. No adhesive is present at the time substrate interposer 120 is mounted over first surface 162 of eWLB 170. Accordingly, electrical interconnections 128 of substrate interposer 120 are self-aligned to exposed conductive layer 104 of eWLB 170. Self-alignment of electrical interconnection 128 of substrate interposer 120 to exposed conductive layer 104 of eWLB 170 provides better alignment than attaching an interposer substrate with pre-applied adhesive to an eWLB.

In FIG. 5i, bumps 128 are bonded to conductive layer 104 using a suitable attachment or bonding process. In one embodiment, the bump material is reflowed by heating the material above its melting point to form spherical balls or bumps 128. In some applications, bumps 128 are reflowed a second time to improve electrical contact to conductive layer 104. In one embodiment, bumps 128 are formed over a UBM having a wetting layer, barrier layer, and adhesive layer. The bumps can also be compression bonded or thermocompression bonded to conductive layer 104. Bumps 128 represent one type of interconnect structure that can be formed over conductive layer 104. The interconnect structure can also use bond wires, conductive paste, stud bump, micro bump, or other electrical interconnect.

In FIG. 5j, an adhesive layer 180 is dispensed through openings 126 in substrate interposer 120 to deposit the adhesive layer between the substrate interposer and eWLB 170. Because adhesive layer 180 is dispensed through openings 126 in substrate interposer 120 after the interposer substrate is mounted over first surface 162 of eWLB 170, a wide range of UF materials can be used as the adhesive layer. Adhesive layer 180 can be thermal epoxy, epoxy resin, B-stage epoxy laminating film, ultraviolet (UV) B-stage film adhesive layer, UV B-stage film adhesive layer including acrylic polymer, thermo-setting adhesive film layer, wire-in-film (WIF) encapsulant material, a suitable wafer backside coating, epoxy resin with organic filler, silica filler, or polymer filler, acrylate based adhesive, epoxy-acrylate adhesive, or a PI-based adhesive. Adhesive layer 180 is generally only minimally conductive. In some embodiments, however, adhesive layer 180 includes a non-conductive material, e.g., an underfill material such as epoxy, epoxy-resin adhesive material, polymeric materials, films, or other non-conductive materials. In one embodiment, adhesive layer 180 covers bumps 128 of substrate interposer 120. In FIG. 5j, adhesive layer 180 is cured. Adhesive layer 180 secures substrate interposer 120 to eWLB 170 forming double-sided fan-out wafer level eWLB PoPb 182. In one embodiment, a pitch of conductive layer 122a of substrate interposer 120 is greater than a pitch of RDL 152. In another embodiment, a pitch of conductive layer 122a of substrate interposer 120 is less than a pitch of RDL 152. Because a pitch of conductive layer 122a of substrate interposer 120 is different from a pitch of RDL 152, eWLB PoPb 182 can accommodate a PoPt with a different ball pitch or layout than eWLB 170.

Because adhesive layer 180 is dispensed through openings 126 in substrate interposer 120 after the interposer substrate is mounted over first surface 162 of eWLB 170, there is no contamination of the adhesive layer on the joints between bumps 128 and conductive layer 104. Because contamination of adhesive layer 180 on the joints between bumps 128 and conductive layer 104 is not a concern, the adhesive may be disposed all the way to bumps 128, rather than being confined to semiconductor die 84. Additionally, depositing adhesive layer 180 after mounting substrate interposer 120 to eWLB 170 makes it much easier to ensure the proper amount of the adhesive layer is dispensed. Because adhesive layer 180 is dispensed through openings 126 in substrate interposer 120 after the interposer substrate is mounted over first surface 162 of eWLB 170, a wide range of UF materials can be used as the adhesive layer.

Figure 6A:
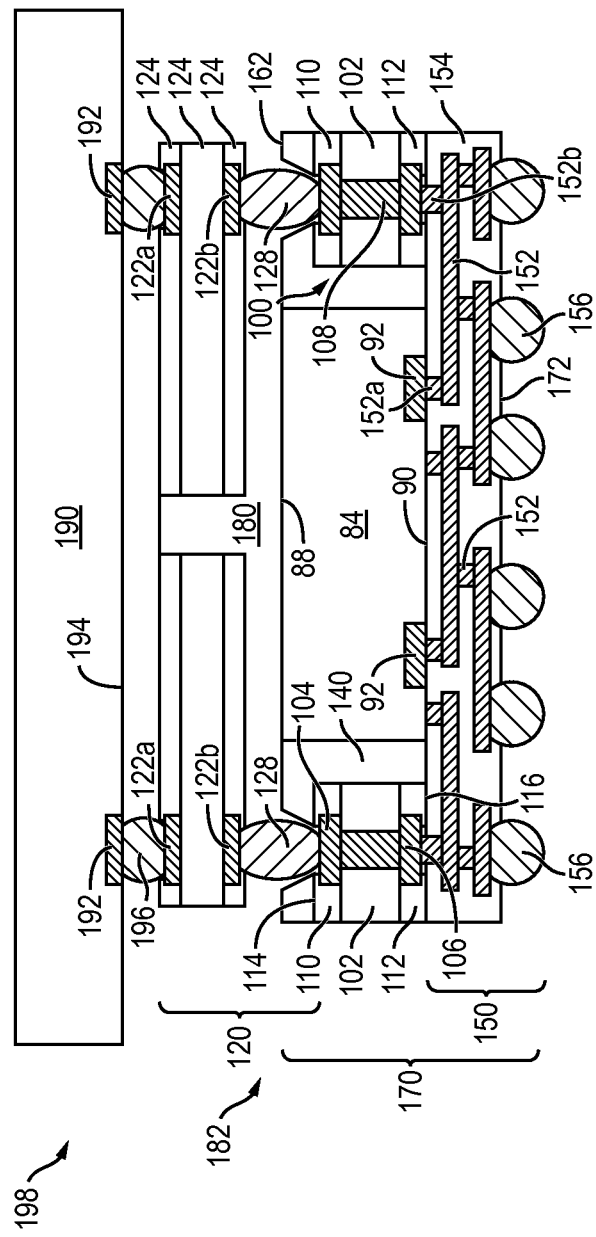
FIGS. 6a-6c illustrate PoP semiconductor devices including a PoPt mounted to a double-sided fan-out wafer level eWLB PoPb.

FIG. 6a shows PoPt 190 disposed over eWLB PoPb 182. PoPt 190 can be an individual semiconductor die or a semiconductor package. PoPt 190 includes bumps or interconnect structures 196 formed over conductive layer 192. Conductive layer 192 is formed over active surface 194 of the semiconductor die. Bumps 196 connect conductive layer 192 of PoPt 190 to conductive layer 122a of eWLB PoPb 182. Bumps 196 represent one type of interconnect structure that can be formed over conductive layer 192. The interconnect structure can also use bond wires, conductive paste, stud bump, micro bump, or other electrical interconnect. Together, eWLB PoPb 182 and PoPt 190 form PoP 198. In FIG. 6a, a pitch of conductive layer 122a of eWLB PoPb 182 is less than a pitch of RDL 152 of eWLB PoPb 182.

Figure 6B:
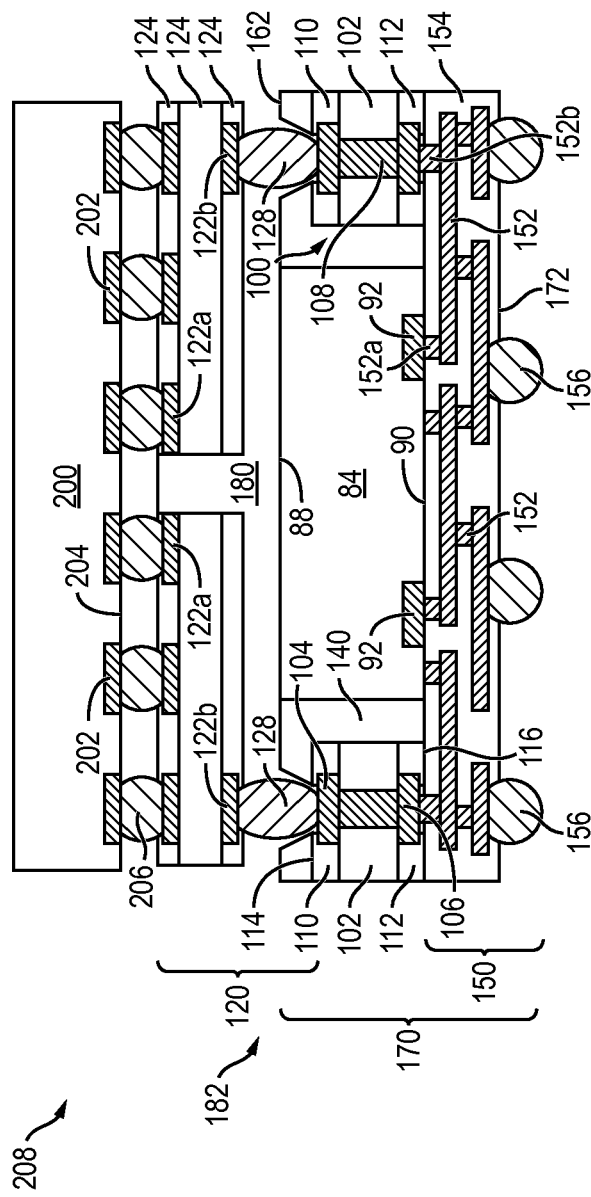

FIG. 6b shows PoPt 200 disposed over eWLB PoPb 182. PoPt 200 can be an individual semiconductor die or a semiconductor package. PoPt 200 includes bumps or interconnect structures 206 formed over conductive layer 202. Conductive layer 202 is formed over active surface 204 of the semiconductor die. Bumps 206 connect conductive layer 202 of PoPt 200 to conductive layer 122a of eWLB PoPb 182. Bumps 206 represent one type of interconnect structure that can be formed over conductive layer 202. The interconnect structure can also use bond wires, conductive paste, stud bump, micro bump, or other electrical interconnect. Together, eWLB PoPb 182 and PoPt 200 form PoP 208. In FIG. 6b, a pitch of conductive layer 122a of eWLB PoPb 182 is greater than a pitch of RDL 152 of eWLB PoPb 182.

Figure 6C:
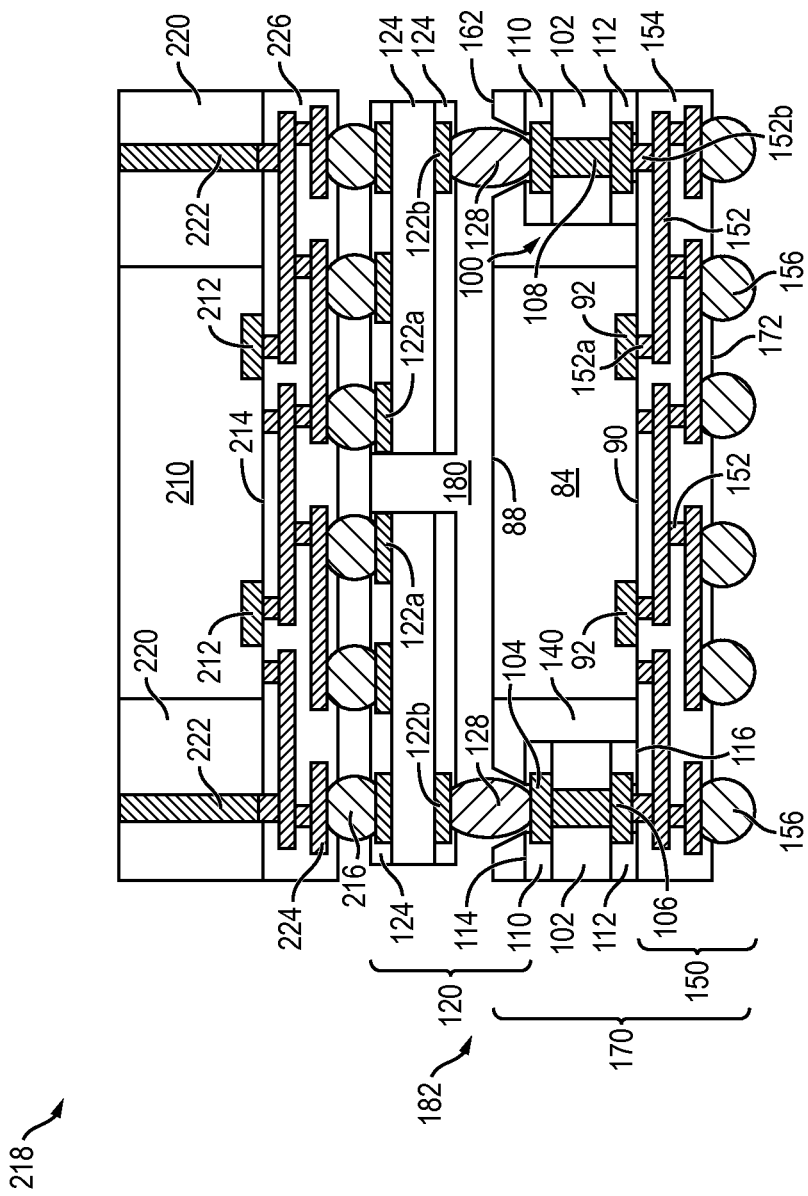

FIG. 6c shows PoPt 210 disposed over eWLB PoPb 182. PoPt 210 can be an individual semiconductor die or a semiconductor package. PoPt 210 includes bumps or interconnect structures 216 electrically connect to conductive layer 212. Conductive layer 212 is formed over active surface 214 of the semiconductor die. PoPt 210 includes encapsulant 220, similar to encapsulant 140 of eWLB 170. PoPt 210 also includes vias or conductive pillars 222 through encapsulant 220. An electrically conductive layer or RDL 224 is formed over active surface 214 and encapsulant 220 using a patterning and metal deposition process such as sputtering, electrolytic plating, and electroless plating. RDL 224, similar to RDL 152 of eWLB 170, connects conductive layer 212 to bumps 216. An insulating or passivation layer 226 is formed between conductive layers 224 for electrical isolation. Insulating layer 226 is similar to insulating layer 154 of eWLB 170. Bumps 216 connect RDL 224 and conductive layer 212 of PoPt 210 to conductive layer 122a of eWLB PoPb 182. Bumps 216 represent one type of interconnect structure that can be formed over RDL 224. The interconnect structure can also use bond wires, conductive paste, stud bump, micro bump, or other electrical interconnect. Together, eWLB PoPb 182 and PoPt 210 form PoP 218. In FIG. 6c, a pitch of conductive layer 122a of eWLB PoPb 182 is equal to a pitch of RDL 152 of eWLB PoPb 182.

The subject method of forming double-sided fan-out wafer level eWLB PoPb 182 has many advantages over other methods of forming PoPbs. The cost of eWLB PoPb 182 is much lower than a comparable dual RDL PoPb because multiple processing steps, including a temporary bonding and debonding process are eliminated. The production throughput of eWLB PoPb 182 is much higher than a comparable dual RDL PoPb because multiple processing steps, including a temporary bonding and debonding process are eliminated. Yield of eWLB PoPb 182 is higher than the yield of a comparable PoPb with a substrate interposer including pre-applied adhesive for at least three reasons. Self-alignment of electrical interconnection 128 of substrate interposer 120 to exposed conductive layer 104 of eWLB 170 allows better alignment than found in comparable PoPb with a substrate interposer including pre-applied adhesive, increasing yield. Adhesive layer 180 is dispensed through openings 126 in substrate interposer 120 after the interposer substrate is mounted over first surface 162 of eWLB 170, ensuring there is no contamination of the adhesive layer on the joints between bumps 128 and conductive layer 104, increasing yield. Additionally, depositing adhesive layer 180 after mounting the substrate interposer 120 to eWLB 170 makes it much easier to ensure the proper amount of the adhesive layer is dispensed, increasing yield. Reliability of eWLB PoPb 182 is higher than the reliability of a comparable PoPb with a substrate interposer including pre-applied adhesive for at least two reasons. Contamination of adhesive layer 180 on the joints between bumps 128 and conductive layer 104 is not a concern, accordingly, adhesive may be disposed all the way to the bumps 128, rather than being confined to semiconductor die 84, increasing reliability. Adhesive layer 180 is dispensed through openings 126 in substrate interposer 120 after the interposer substrate is mounted over first surface 162 of eWLB 170, allowing a wide range of UF materials to be used as the adhesive layer, increasing reliability.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die,
    disposing the semiconductor die on a carrier with an active surface of the semiconductor die oriented toward the carrier;
    disposing a vertical interconnect structure on the carrier adjacent to the semiconductor die, wherein the vertical interconnect structure includes an insulating material and a conductive via formed through the insulating material;
    depositing an encapsulant over the semiconductor die and vertical interconnect structure;
    removing the carrier after depositing the encapsulant to expose the active surface of the semiconductor die and a surface of the encapsulant;
    forming a build-up interconnect structure over the active surface of the semiconductor die after removing the carrier;
    backgrinding the encapsulant to expose a back surface of the semiconductor die opposite the active surface;
    providing a substrate including a bump and an opening formed through the substrate;
    disposing the substrate over the semiconductor die with the opening over the back surface of the semiconductor die, wherein a footprint of the opening is smaller than a footprint of the semiconductor die;
    bonding the bump of the substrate to the vertical interconnect structure by reflowing the bump with the bump vertically aligned to the conductive via; and
    disposing an adhesive through the opening in the substrate and between the substrate and the semiconductor die after bonding the bump of the substrate to the vertical interconnect structure, wherein the adhesive contacts the bump and covers the back surface of the semiconductor die.

2. The method of claim 1, further including forming a plurality of openings in the substrate.

3. The method of claim 1, wherein a pitch of the substrate is greater than a pitch of the build-up interconnect structure.

4. The method of claim 1, wherein a pitch of the substrate is less than a pitch of the build-up interconnect structure.

5. A method of making a semiconductor device, comprising:
    providing a semiconductor package including,
        a semiconductor die,
        a vertical interconnect structure disposed adjacent to the semiconductor die, and
        an encapsulant deposited between the semiconductor die and vertical interconnect structure, wherein a back an active surface of the semiconductor die is coplanar with a first surface of the encapsulant and a back surface of the semiconductor die opposite the active surface is coplanar with a second surface of the encapsulant;
    providing a substrate including an opening in the substrate;
    disposing the substrate over the semiconductor package with the back surface of the semiconductor die oriented toward the substrate; and
    disposing an adhesive through the opening and between the substrate and the semiconductor package after disposing the substrate over the semiconductor package, wherein the adhesive contacts the back surface of the semiconductor die and the surface of the encapsulant.

6. The method of claim 5, further including forming a plurality of openings in the substrate.

7. The method of claim 5, wherein the semiconductor package further includes a redistribution layer (RDL) over the active surface of the semiconductor die.

8. The method of claim 7, wherein a pitch of the substrate is greater than a pitch of the RDL.

9. The method of claim 7, wherein a pitch of the substrate is less than a pitch of the RDL.

10. The method of claim 5, wherein the adhesive extends to the vertical interconnect structure.

11. The method of claim 5, further including:
    forming an interconnect structure over the substrate; and
    self-aligning the interconnect structure of the substrate with the vertical interconnect structure of the semiconductor package.

12. A method of making a semiconductor device, comprising:
    providing a semiconductor die;
    depositing an encapsulant around the semiconductor die;
    backgrinding the encapsulant to expose a surface of the semiconductor die;
    providing a substrate including an opening and an interconnect structure disposed on a surface of the substrate;
    disposing the substrate over the surface of the semiconductor die and encapsulant with the surface of the substrate oriented toward the semiconductor die, wherein the opening is smaller than the semiconductor die; and
    depositing an adhesive between the semiconductor die and substrate through the opening.

13. The method of claim 12, further including providing the substrate including a plurality of openings.

14. The method of claim 12, further including forming a redistribution layer (RDL) over the semiconductor die and encapsulant.

15. The method of claim 12, further including forming a conductive bump over the substrate, wherein depositing the adhesive includes depositing the adhesive extending to the conductive bump.

16. A method of making a semiconductor device, comprising:
    providing a semiconductor die;
    depositing an encapsulant over the semiconductor die, wherein an active surface of the semiconductor die is coplanar with a first surface of the encapsulant and a back surface of the semiconductor die opposite the active surface is coplanar with a second surface of the encapsulant;

providing a substrate including an opening;

disposing the substrate over the semiconductor die with a bottom surface of the substrate oriented toward the semiconductor die and the back surface of the semiconductor die oriented toward the substrate; and depositing an adhesive between the back surface of the semiconductor die and the bottom surface of the substrate through the opening.

17. The method of claim 16, further including forming a plurality of openings in the substrate.

18. The method of claim 16, further including forming a redistribution layer (RDL) over the active surface of the semiconductor die and the encapsulant.

19. The method of claim 18, wherein a pitch of the substrate is greater than a pitch of the RDL.

20. The method of claim 18, wherein a pitch of the substrate is less than a pitch of the RDL.

21. The method of claim 16, further including providing an interconnect structure electrically coupled between the substrate and semiconductor die, wherein depositing the adhesive includes depositing the adhesive extending to the interconnect structure.

22. The method of claim 12, further including:

disposing a vertical interconnect structure adjacent to the semiconductor die;

depositing the encapsulant over the vertical interconnect structure; and wherein the encapsulant remains covering the vertical interconnect structure after the backgrinding step.

23. The method of claim 22, wherein the vertical interconnect structure includes:

an insulating material; and a conductive via extending through the insulating material.

24. The method of claim 5, wherein the active surface of the semiconductor die is oriented in substantially the same direction as the first surface of the encapsulant.

25. The method of claim 24, wherein the back surface of the semiconductor die is oriented in substantially the same direction as the second surface of the encapsulant.

* * * * *